(12) United States Patent
Takao

(10) Patent No.: US 9,181,381 B2
(45) Date of Patent: Nov. 10, 2015

(54) PHOTOSENSITIVE RESIN COMPOSITION AND CURED FILM

(75) Inventor: Yasuyuki Takao, Kisarazu (JP)

(73) Assignee: NIPPON STEEL & SUMIKIN CHEMICAL CO., LTD., Tokyo (JP)

( * ) Notice: Subject to any disclaimer, the term of this patent is extended or adjusted under 35 U.S.C. 154(b) by 377 days.

(21) Appl. No.: 13/257,989

(22) PCT Filed: Mar. 24, 2010

(86) PCT No.: PCT/JP2010/055114
§ 371 (c)(1), (2), (4) Date: Sep. 21, 2011

(87) PCT Pub. No.: WO2010/110335
PCT Pub. Date: Sep. 30, 2010

(65) Prior Publication Data
US 2012/0015298 A1   Jan. 19, 2012

(30) Foreign Application Priority Data

Mar. 26, 2009 (JP) ................................. 2009-077371
Oct. 8, 2009 (JP) ................................. 2009-234282

(51) Int. Cl.
  *C08F 2/50* (2006.01)
  *C08F 290/14* (2006.01)
  *C08G 73/10* (2006.01)
  *C08G 73/16* (2006.01)
  *C09D 179/08* (2006.01)
  *G03F 7/037* (2006.01)
  *C08F 299/02* (2006.01)
  *C08G 73/12* (2006.01)
  *H05K 3/28* (2006.01)

(52) U.S. Cl.
  CPC ............... *C08F 299/022* (2013.01); *C08F 2/50* (2013.01); *C08F 290/145* (2013.01); *C08G 73/1042* (2013.01); *C08G 73/1075* (2013.01); *C08G 73/12* (2013.01); *C08G 73/16* (2013.01); *C09D 179/085* (2013.01); *G03F 7/037* (2013.01); *H05K 3/287* (2013.01)

(58) Field of Classification Search
  CPC .... C08F 290/145; C08F 299/022; C08F 2/50; C08G 73/1042; C08G 73/1075; C08G 73/12; C08G 73/16; C09D 179/085; G03F 7/037; H05K 3/287
  USPC .............................. 430/283.1; 528/329.1, 353
  See application file for complete search history.

(56) References Cited

U.S. PATENT DOCUMENTS

| | | | |
|---|---|---|---|
| 5,399,460 A * | 3/1995 | Aldrich et al. | ............. 430/287.1 |
| 5,472,823 A | 12/1995 | Hagiwara et al. | |
| 6,335,416 B1 * | 1/2002 | Nojiri et al. | ................... 528/170 |
| 2009/0202786 A1 | 8/2009 | Tokuhisa et al. | |
| 2009/0306329 A1 * | 12/2009 | Hasegawa | ..................... 528/289 |

FOREIGN PATENT DOCUMENTS

| | | | | |
|---|---|---|---|---|
| JP | 5-301959 A | 11/1993 | | |
| JP | 2002-3516 A | 1/2002 | | |
| JP | 2008-70477 A | 3/2008 | | |
| WO | WO 2006/109514 A1 | 10/2006 | | |
| WO | WO 2008/091011 | * | 7/2009 | ............. C08G 73/16 |

OTHER PUBLICATIONS

International Preliminary Report on Patentability issued Oct. 6, 2011, in PCT International Patent Application No. PCT/JP2010/055114.
International Search Report, dated Apr. 27, 2010, issued in PCT/JP2010/055114.

* cited by examiner

*Primary Examiner* — Michael Pepitone
*Assistant Examiner* — Jessica Roswell
(74) *Attorney, Agent, or Firm* — Birch, Stewart, Kolasch & Birch, LLP

(57) ABSTRACT

Disclosed is a photosensitive resin composition capable of displaying satisfactory patterning performance against an alkaline developer and yielding a cured film of a sufficiently low coefficient of linear thermal expansion. The photosensitive resin composition contains a photopolymerization initiator and a polyimide precursor obtained by the reaction of an ester-containing diamine such as 4-aminophenyl 4'-aminobenzoate, a biphenyl-based diamine such as 4,4'-diamino-2,2'-dimethylbiphenyl, and an unsaturated group-containing diamine such as 4,4'-diamino-2,2'-divinylbiphenyl with an acid anhydride such as pyromellitic dianhydride. The content of the structural unit derived from the unsaturated group-containing diamine in the polyimide precursor is 5-60 mol %.

6 Claims, No Drawings

PHOTOSENSITIVE RESIN COMPOSITION AND CURED FILM

FIELD OF TECHNOLOGY

This invention relates to a photosensitive resin composition that is capable of forming a pattern by photoirradiation, shows excellent solubility in developers based on aqueous alkaline solutions, and yields a cured film having a low coefficient of linear thermal expansion. This photosensitive resin composition is applicable to protective films of semiconductor devices, coverlay films, and solder resists on account of its good thermal and chemical resistance.

BACKGROUND TECHNOLOGY

A resin obtained from a polyamic acid or a polyimide precursor to which a compound having a polymerizable unsaturated linkage is chemically added or from a mixture of a polyamic acid and a compound having a polymerizable unsaturated linkage has been used as a photosensitive polyimide. A photosensitive polyimide of this kind belongs to a group of negative type photosensitive materials that form patterns by photocrosslinking of the unsaturated linkages in the presence of a photopolymerization initiator (patent documents 1 and 2). Since a polyamic acid used therein has a rigid structure, a solvent of high dissolving power such as N-methylpyrrolidone (NMP) is required as a developer after exposure to light. However, developers such as this generate a high environmental load and the disposal of waste developers incurs an enormous cost. Since an aqueous alkaline developer generates a low environmental load and is disposable at low cost, there has been a demand for photosensitive polyimides to which an aqueous alkaline developer is applicable.

Of photosensitive polyimides, the ones with a rigid backbone generally tend to have a low coefficient of linear thermal expansion. However, these photosensitive polyimides contain a large number of unsaturated linkages to act as photosensitive groups and, further, their aliphatic side chains are long; hence, they have a shortcoming that the coefficient of linear thermal expansion tends to become higher. When a photosensitive polyimide of a high coefficient of linear thermal expansion is cured, for example, on a wafer of a semiconductor, there develops a possibility that the mismatch of the coefficient of linear thermal expansion between the wafer and the polyimide after curing causes the wafer to warp. There are some indications that this warpage has a potentiality to cause inconveniences during the fabrication of semiconductors such as affecting the reliability of connection to an interposer in flip-chip package and making it difficult to handle the wafer in the process.

To solve the problem of solubility in developers among the aforementioned problems, positive type photosensitive materials are proposed wherein a polyamic acid resin to which a phenolic hydroxyl group is introduced and/or a polyamic acid resin containing a phenolic hydroxyl group such as a polybenzoxazole precursor and naphthoquinonediazide are used (patent documents 3, 4, and 5). However, in order to suppress dissolution before exposure to light and secure the alkali developing property after exposure to light, these positive type resists contain a large amount of the photosensitizer naphthoquinonediazide in relation to the resin and this is considered responsible for lowering the concentration of the resin and causing a problem in the strength of the film. Further, as a technique to overcome the problem of warpage, the incorporation of a siloxane-containing polyimide in a photosensitive resin composition is proposed to reduce the warpage by increasing the elongation of a film to be formed from the composition (patent document 6). The resin composition thus proposed surely improves the elongation, but fails to correct the mismatch of coefficient of linear thermal expansion and a strain still remains in the resin. For this reason, the proposed technique still raises concerns that such a strain might generate cracks to affect long-term reliability.

A photosensitive polyamic acid resin composition needs to be imidized generally at high temperatures above 300° C. Since a high temperature treatment such as this is difficult to perform in the manufacturing process of semiconductors, a demand has been created for photosensitive polyamic acid resin compositions that can be imidized at low temperatures. To solve this problem, the introduction of a catalyst that becomes active at the time of curing is proposed (patent documents 7 and 8). However, a matter of concern here is that the catalyst exerts adverse influences such as deterioration of storage stability and lowering of reliability by corrosion of the circuit. A photosensitive resin composition that is highly storage-stable at room temperature and requires no high-temperature treatment at the time of curing is proposed (patent document 9). However, since siloxane units are introduced into the molecule in the proposed photosensitive resin composition, a cured film obtained from the composition has a high coefficient of linear thermal expansion and is not free from the problem of warpage.

PRIOR-ART TECHNICAL DOCUMENTS

Patent Documents

Patent document 1: JP1979-109828 A

Patent document 2: JP2008-83468 A

Patent document 3: JP1992 4-31860 A

Patent document 4: JP1981-27140 A

Patent document 5: JP2008-158263 A

Patent document 6: JP2007-132978 A

Patent document 7: JP2008-281961 A

Patent document 8: JP2007-84798 A

Patent document 9: WO2006/109514

SUMMARY OF THE INVENTION

An object of this invention is provide a photosensitive resin composition that is capable of forming a pattern by photoirradiation, shows excellent solubility in developers based on aqueous alkaline solutions, and yields a cured film with a low coefficient of linear thermal expansion.

The inventors of this invention have conducted intensive studies to solve the aforementioned problems, found that specifying the structure of a polyimide resin to be incorporated in a photosensitive resin composition can solve the problems, and completed this invention.

Accordingly, this invention relates to a photosensitive resin composition containing a polyimide precursor having structural units represented by the following formulas (1), (2), and (3) and a photopolymerization initiator wherein the proportion of the structural unit represented by formula (3) in the polyimide precursor is 5-60 mol %.

(1)

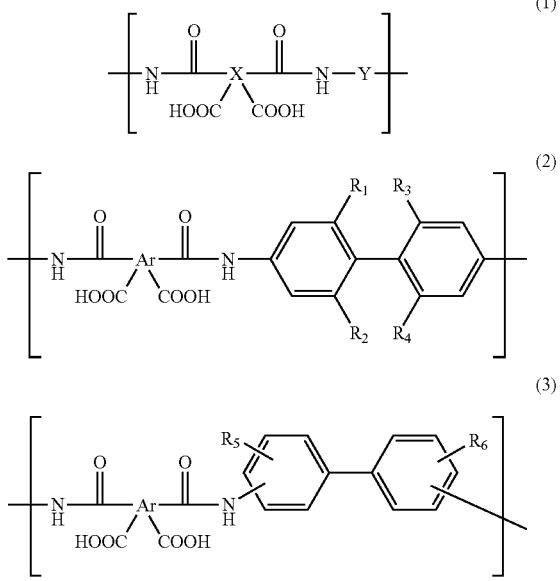

(2)

(3)

In formula (1), X is a tetravalent aromatic group formed by removing the carboxyl groups from an aromatic tetracarboxylic acid, Y is a divalent aromatic group formed by removing the amino groups from an aromatic diamine and one or both of X and Y contain at least one ester group (—COO—). In formulas (2) and (3), Ar is a tetravalent aromatic group formed by removing the carboxyl groups from an aromatic tetracarboxylic acid and each of $R_1$ to $R_4$ is independently a hydrogen atom, a substituted or unsubstituted alkyl group of 1-6 carbon atoms, a phenyl group, or an alkoxyl group of 1-6 carbon atoms, and each of $R_5$ and $R_6$ is independently a monovalent organic group of 2-6 carbon atoms having a radically polymerizable unsaturated linkage.

Another mode of this invention relates to a photosensitive resin composition containing a polyimide precursor having structural units represented by the following formulas (1a), (2a), and (3a) and a photopolymerization initiator wherein the proportion of the structural unit represented by formula (3a) in the polyimide precursor is 5-60 mol %.

(1a)

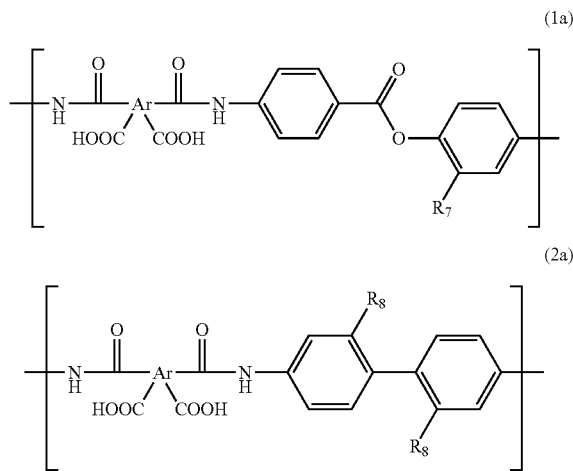

(2a)

(3a)

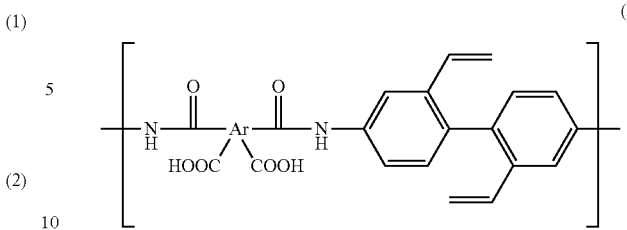

In formulas (1a) and (2a), each of $R_7$ and $R_8$ is a hydrogen atom, an alkyl group of 1-6 carbon atoms, or an alkoxyl group of 1-6 carbon atoms and, in formulas (1a) to (3a), Ar is a tetravalent hydrocarbon group.

A photosensitive resin composition in this invention is preferably formulated from 100 parts by weight of the polyimide precursor and 1-20 parts by weight of a photopolymerization initiator and, further, it is preferably developable by a developer based on an aqueous alkaline solution.

Further, this invention relates to a cured film that is obtained by subjecting the aforementioned photosensitive composition to exposure to light and heat curing and has a coefficient of linear thermal expansion of not more than $40 \times 10^{-6}$/K.

PREFERRED EMBODIMENTS OF THE INVENTION

This invention will be explained in detail below.

A photosensitive resin composition in this invention contains a polyimide precursor (also referred to as a polyamic acid) and a photopolymerization initiator and the composition is capable of forming a pattern by photoirradiation. The polyimide precursor has the structural units represented by the aforementioned formulas (1), (2), and (3).

Alternatively, the polyimide precursor has the structural units represented by the aforementioned formulas (1a), (2a), and (3a). In formulas (1a), (2a), and (3a), Ar has the same meaning as Ar in the aforementioned formulas (1), (2), and (3) and each of $R_7$ and $R_8$ is explained in the same way as $R_1$ and $R_2$.

The structural unit represented by formula (1) is obtained by the reaction of an aromatic tetracarboxylic acid dianhydride with an aromatic diamine wherein one or both of the aromatic tetracarboxylic acid dianhydride and the aromatic diamine contain an ester group. The ester group as referred to in this specification is an ester linkage denoted by —COO—. In formula (1), X is a tetravalent aromatic group formed by removing the carboxyl groups from an aromatic tetracarboxylic acid while Y is a divalent aromatic group formed by removing the amino groups from an aromatic diamine.

The structural unit represented by formula (1) can be obtained by selecting an aromatic tetracarboxylic acid dianhydride containing an ester group and an aromatic diamine containing an ester group and using at least one of them in the aforementioned reaction. From the viewpoint of obtaining a film with a property of low thermal expansion by curing of a photosensitive resin composition according to this invention, it is preferable to use an aromatic tetracarboxylic acid dianhydride containing no ester group and an aromatic diamine containing an ester group.

Examples of the ester group-containing aromatic tetracarboxylic acid dianhydrides include aromatic tetracarboxylic acid dianhydrides represented by the following formula (4). They are used singly or as a mixture of two species or more.

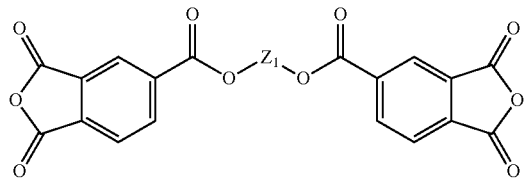

(4)

In formula (4), $Z_1$ is a divalent organic group selected from the aromatic groups illustrated below.

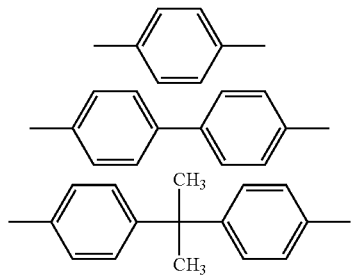

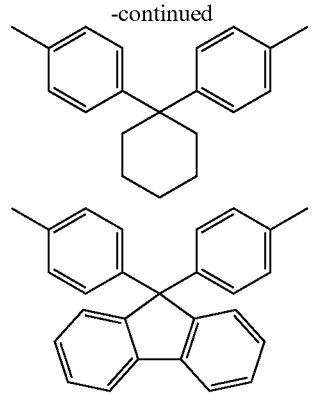

Preferable examples of the ester group-containing aromatic diamines are represented by $NH_2$—Ar—COO—Ar—$NH_2$ or $NH_2$—Ar—OCO—Ar-Q-Ar—OCO—Ar—$NH_2$ wherein Ar is independently a benzene ring which may optionally have a substituent and Q is a direct bond or a hydrocarbon group of 1-8 carbon atoms. The aforementioned substituent is preferably an alkyl group of 1-6 carbon atoms or an alkoxyl group of 1-6 carbon atoms. More preferably, an ester group-containing aromatic diamine is selected from the diamines illustrated below and a single species or a combination of two species or more is used.

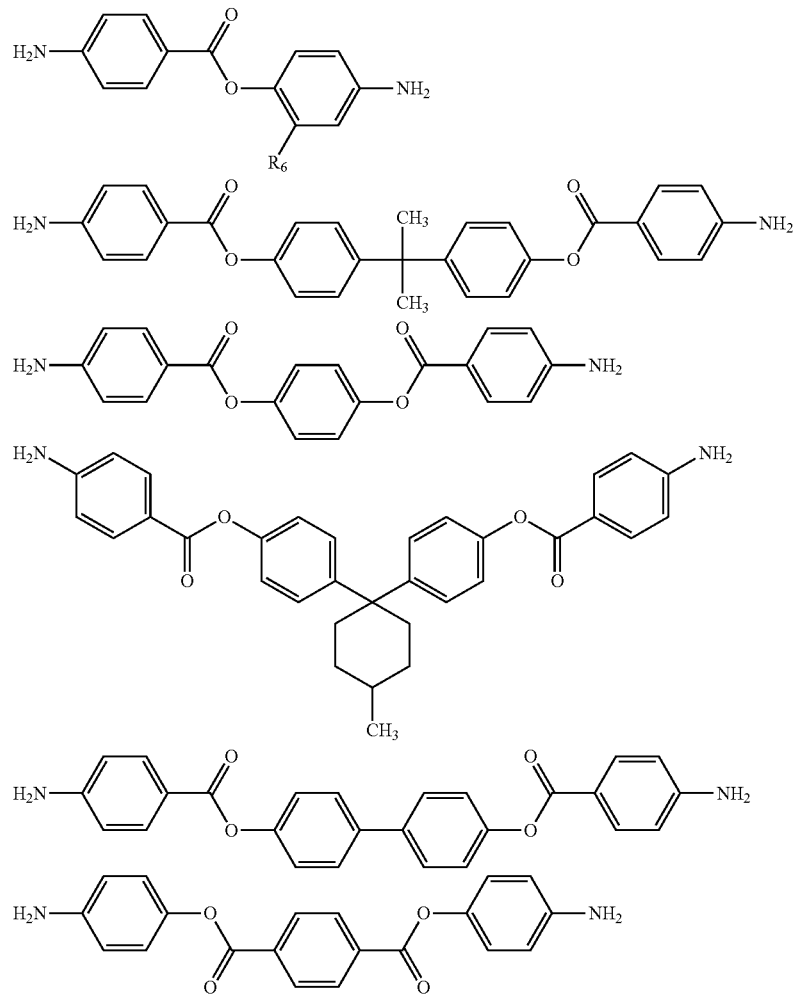

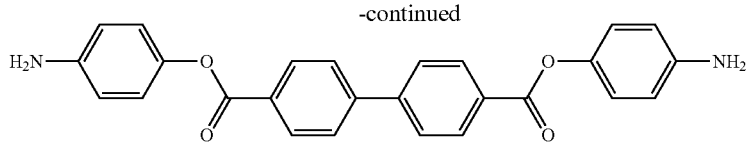

Of the aforementioned diamines, the one whose chemical formula is illustrated below is preferred from the viewpoint of obtaining a film having a property of low thermal expansion by curing of a photosensitive resin composition in this invention.

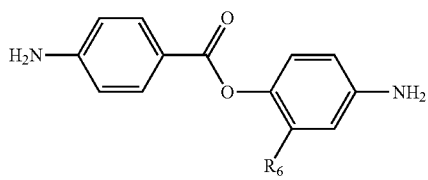

In this chemical formula, $R_6$ is preferably a hydrogen atom, an alkyl group of 1-6 carbon atoms, or an alkoxyl group of 1-6 carbon atoms; more preferably, $R_6$ is a hydrogen atom, an alkyl group of 1-2 carbon atoms, or an alkoxyl group of 1-2 carbon atoms.

Of the structural units represented by formula (1), a particularly preferable structure is the one represented by the following formula (5).

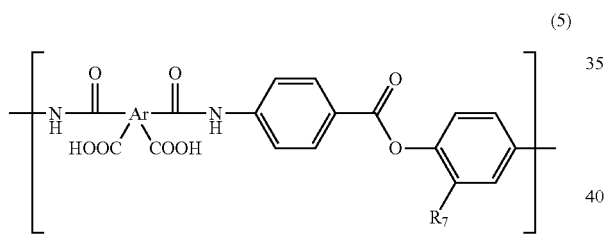

The structural unit represented by formula (5) is obtained by the reaction of a diamine having a structure of 4-aminophenyl 4'-aminobenzoate with an aromatic tetracarboxylic acid dianhydride. In formula (5), $R_7$ is a hydrogen atom, an alkyl group of 1-6 carbon atoms, or an alkoxyl group of 1-6 carbon atoms; Ar is a tetravalent aromatic group formed by removing the carboxyl groups from an aromatic tetracarboxylic acid or a tetravalent hydrocarbon group; preferably, $R_7$ is a hydrogen atom, an alkyl group of 1-2 carbon atoms, or an alkoxyl group of 1-2 carbon atoms.

In order to obtain the structural unit represented by formula (1), it is allowable to use an aromatic tetracarboxylic acid dianhydride containing no ester group or an aromatic diamine containing no ester group and a mention will be made of such aromatic tetracarboxylic acid dianhydrides and aromatic diamines later.

The structural unit represented by formula (2) is obtained by the reaction of an aromatic tetracarboxylic acid dianhydride with an aromatic diamine having a structure of 4,4'-diaminobiphenyl. In formula (2), Ar is a tetravalent aromatic group formed by removing the carboxyl groups from an aromatic tetracarboxylic acid and each of $R_1$ to $R_4$ is independently a hydrogen atom, a substituted or unsubstituted alkyl group of 1-6 carbon atoms, a phenyl group, or an alkoxyl group of 1-6 carbon atoms.

An aromatic diamine having a structure of 4,4'-diaminobiphenyl is represented by the following formula (6).

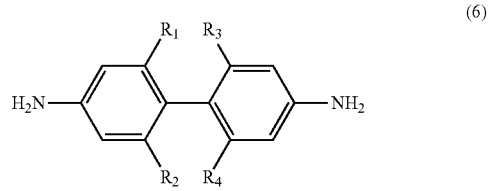

In formula (6), each of $R_1$ to $R_4$ is independently a hydrogen atom, a substituted or unsubstituted alkyl group of 1-6 carbon atoms, or an alkoxyl group of 1-6 carbon atoms; preferably each of $R_1$ to $R_4$ is independently an alkyl group of 1-6 carbon atoms, a fluorine-substituted alkyl group of 1-3 carbon atoms, or an alkoxyl group of 1-3 carbon atoms.

An aromatic diamine having a structure of 4,4'-diaminobiphenyl is preferably selected from the aromatic diamines illustrated in chemical formula below and a single species or a combination of two species or more may be used.

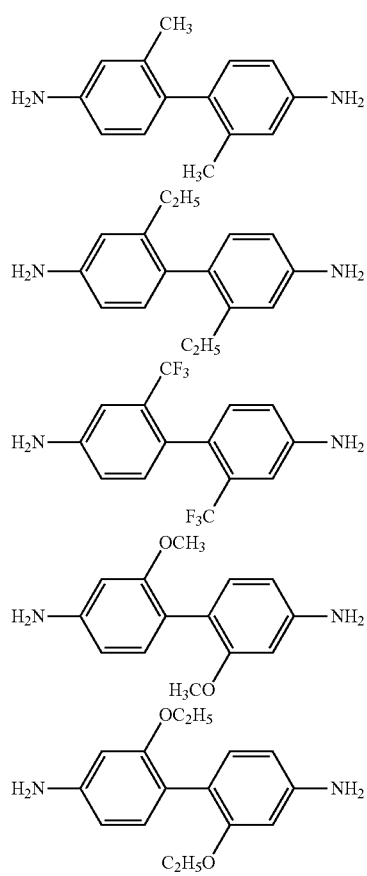

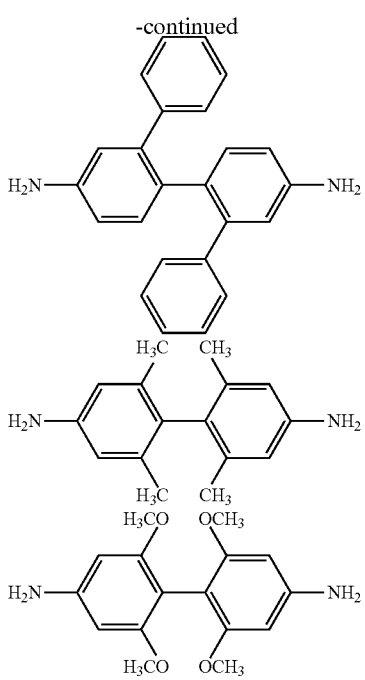

Preferable among the structural units represented by formula (2) is the one represented by the following formula (7).

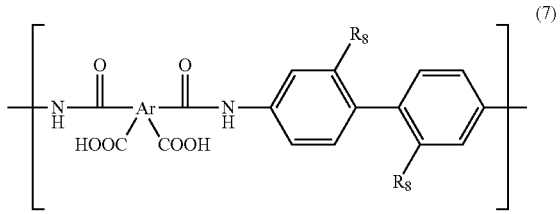

The structural unit represented by formula (7) is obtained by the reaction of a diamine having a structure of 4,4'-diaminobiphenyl with an aromatic tetracarboxylic acid dianhydride. In formula (7), $R_8$ is a hydrogen atom, a substituted or unsubstituted alkyl group of 1-6 carbon atoms, a phenyl group, or a substituted or unsubstituted alkoxyl group of 1-6 carbon atoms; Ar is a tetravalent aromatic group; $R_8$ is preferably an alkyl group of 1-2 carbon atoms, an alkoxyl group of 1-2 carbon atoms, or a fluorine-substituted alkyl group of 1-2 carbon atoms.

The diamines useful for the preparation of a polyimide precursor having the structural unit represented by formula (7) include 4,4'-diamino-2,2'-dimethylbiphenyl, 4,4'-diamino-2,2'-diethylbiphenyl, 4,4'-diamino-2,2'-bis(trifluoromethyl)biphenyl, 4,4'-diamino-2,2'-diphenylbiphenyl, 4,4'-diamino-2,2'-dimethoxybiphenyl, and 4,4'-diamino-2,2'-diethoxybiphenyl. The aforementioned diamines or tetracarboxylic acid dianhydrides may be used singly or as a mixture of two species or more.

The structural unit represented by formula (3) is obtained by the reaction of an aromatic tetracarboxylic acid dianhydride with an aromatic diamine having a radically polymerizable unsaturated linkage. In formula (3), Ar is a tetravalent aromatic group formed by removing the carboxyl groups from an aromatic tetracarboxylic acid and each of $R_5$ and $R_6$ is independently a monovalent organic group of 2-6 carbon atoms having a radically polymerizable unsaturated linkage.

An aromatic diamine having a radically polymerizable unsaturated linkage is represented by the following general formula (8). The radically polymerizable unsaturated linkage is preferably an ethylenic double bond.

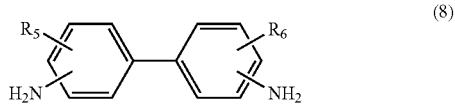

In general formula (8), each of $R_5$ and $R_6$ is independently a monovalent organic group of 2-6 carbon atoms having a radically polymerizable unsaturated linkage, preferably an alkenyl group of 2-6 carbon atoms or a group containing a (meth)acryloxy group represented by $-R_{10}-OOCR_{11}=CH_2$ (wherein $R_{10}$ is a direct bond or a divalent linking group of 1-4 carbon atoms and $R_{11}$ is hydrogen or a methyl group), more preferably an alkenyl group of 2-4 carbon atoms or a (meth)acryloxy group.

Of the aforementioned aromatic diamines having a radically polymerizable unsaturated linkage, those represented by the following formula are preferred from the viewpoint of obtaining a film with a property of low thermal expansion by curing of a photosensitive resin composition in this invention. Here, $R_5$ and $R_6$ are respectively defined as above.

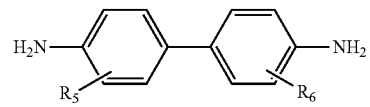

Of the structural units represented by formula (3), the one represented by the following formula (9) is preferred.

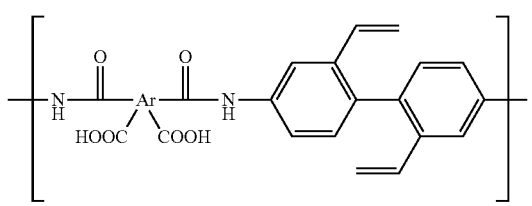

The structural unit represented by formula (9) is obtained by the reaction of 4,4'-diamino-2,2'-divinylbiphenyl with an aromatic tetracarboxylic acid dianhydride. In formula (9), Ar is a tetravalent aromatic group or a tetravalent hydrocarbon group.

As explained above, the structural units represented by formulas (1) to (3) or polyimide precursors having these structural units can be obtained by the reaction of an aromatic tetracarboxylic acid dianhydride with an aromatic diamine. In formulas (1) to (3), X and Ar are respectively tetravalent groups formed by removing the carboxyl groups or acid anhydride groups from an aromatic tetracarboxylic acid or a dianhydride thereof (the residue of an aromatic tetracarboxylic acid) and X and Ar can be understood from explanation of the aromatic tetracarboxylic acid dianhydrides to be used.

An explanation will be given of aromatic tetracarboxylic acid dianhydrides below. In the case where an aromatic tetracarboxylic acid dianhydride containing an ester group is used to obtain the structural unit represented by formula (1), an aromatic tetracarboxylic acid dianhydride represented by formula (4) is preferably used as described earlier. In cases other than this, the aromatic tetracarboxylic acid dianhydrides to be described below are used to obtain the structural units represented by formulas (1) to (3) or to prepare polyimide precursors having these structural units. In the case where the use of an aromatic tetracarboxylic acid dianhydride containing an ester group yields the structural unit represented by formula (2), the structural unit in question is counted as a unit represented by formula (2) and, in other cases, the structural unit obtained is counted as a unit represented by formula (1).

There is no specific restriction on aromatic tetracarboxylic acid dianhydrides to be used and examples include pyromellitic dianhydride, 2,2',3,3'-benzophenonetetracarboxylic acid dianhydride, 2,3,3',4'-benzophenonetetracarboxylic acid dianhydride, 3,3',4,4-benzophenonetetracarboxylic acid dianhydride, 2,3,6,7-naphthalenetetracarboxylic acid dianhydride, 1,2,4,5-naphthalenetetracarboxylic acid dianhydride, 1,4,5,8-naphthalenetetracarboxylic acid dianhydride, 1,2,6,7-naphthalenetetracarboxylic acid dianhydride, 1,2,5,6-naphthalenetetracarboxylic acid dianhydride, 4,8-dimethyl-1,2,3,5,6,7-hexahydronaphthalene-1,2,5,6-tetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, 1,4,5,8-tetrachloronaphthalene-2,3,6,7-tetracarboxylic acid dianhydride, 3,3',4,4'-biphenyltetracarboxylic acid dianhydride, 2,2',3,3'-biphenyltetracarboxylic acid dianhydride, 2,3,3',4'-biphenyltetracarboxylic acid dianhydride, 3,3",4,4"-p-terphenyltetracarboxylic acid dianhydride, 2,3,3",4"-p-terphenyltetracarboxylic acid dianhydride, 2,2",3,3"-p-terphenyltetracarboxylic acid dianhydride, 2,2-bis(2,3-dicarboxyphenyl)propane dianhydride, 2,2-bis(3,4-dicarboxyphenyl)propane dianhydride, bis(2,3-dicarboxyphenyl)ether dianhydride, bis(2,3-dicarboxyphenyl)methane dianhydride, bis(3,4-dicarboxyphenyl)methane dianhydride, bis(2,3-dicarboxyphenyl)sulfone dianhydride, bis(3,4-dicarboxyphenyl)sulfone dianhydride, 1,1-bis(2,3-dicarboxyphenyl)ethane dianhydride, 1,1-bis(3,4-dicarboxyphenyl)ethane dianhydride, 2,3,8,9-perylenetetracarboxylic acid dianhydride, 3,4,9,10-perylenetetracarboxylic acid dianhydride, 4,5,10,11-perylenetetracarboxylic acid dianhydride, 5,6,11,12-perylenetetracarboxylic acid dianhydride, 1,2,7,8-phenanthrenetetracarboxylic acid dianhydride, 1,2,6,7-phenanthrenetetracarboxylic acid dianhydride, 1,2,9,10-phenanthrenetetracarboxylic acid dianhydride, pyrazine-2,3,5,6-tetracarboxylic acid dianhydride, pyrrolidine-2,3,4,5-tetracarboxylic acid dianhydride, thiophene-2,3,4,5-tetracarboxylic acid dianhydride, and 4,4'-oxydiphthalic acid dianhydride. These aromatic tetracarboxylic acid dianhydrides may be used singly or as a combination of two species or more. Of the aforementioned aromatic tetracarboxylic acid dianhydrides, pyromellitic dianhydride is particularly preferable from the viewpoint of securing a low coefficient of linear thermal expansion and good alkali developability.

The structural units represented by the aforementioned formulas (1) to (3) are respectively found in the structures of polyamic acids to be obtained by the reaction of aromatic diamines with aromatic tetracarboxylic acids or dianhydrides thereof and it is allowable that a polyimide precursor in a photosensitive resin composition is partly imidized. However, the rate of this imidization is desirably kept below 10%, preferably below 5%, more preferably below 1%, in order to secure good alkali develop ability. The rate of imidization of a polyimide precursor is determined as follows: the infrared absorption spectrum of a thin film of a polyimide is measured by one-time reflection ATR method with the aid of a Fourier transform infrared spectrophotometer (Model FT/IR620, commercially available from Jasco Corporation) and the rate of imidization is calculated from the absorbance of the C=O stretching at 1780 cm$^{-1}$ ascribable to the imide group using a benzene ring absorbance in the vicinity of 1015 cm$^{-1}$ as an internal standard. It is likely that a proton in the carboxylic acid in the polyamic acid structure acts as an acid catalyst during curing of a photosensitive resin composition thereby enabling the imidization reaction (curing reaction) to occur at low temperatures. A rate of imidization of below 10% is desirable from this point of view as well.

It is necessary to control the proportion of the structural unit of formula (3) in the polyimide precursor in the range of 5-60 mol %, preferably in the range of 15-50 mol %, in relation to the sum of the structural units of formulas (1), (2), and (3). When this proportion is less than 5 mol %, the resulting polyimide cannot acquire a satisfactory ability to form a pattern by crosslinking. When the proportion exceeds 60 mol %, the crosslinking density increases and the film becomes brittle. The proportion of the sum of the structural units of formulas (1) and (2) is controlled in the range of 40-95 mol %, preferably in the range of 50-85 mol %. When the proportion of this sum is less than 40 mol %, it becomes difficult for the resulting polyimide to display the performances ascribable to these structural units such as acquiring the develop ability by an aqueous alkaline solution and providing a low coefficient of linear thermal expansion. When the sum exceeds 95 mol %, the pattern-forming ability becomes insufficient.

The proportion of the structural unit represented by formula (1) in the polyimide precursor is controlled in the range of 10-80 mol %, preferably in the range of 25-70 mol %. When this proportion is less than 10 mol %, the alkali developability tends to deteriorate. When the proportion exceeds 80 mol %, the film to be formed tends to become brittle. The proportion of the structural unit represented by formula (2) is controlled in the range of 5-85 mol %, preferably in the range of 10-60 mol %. When this proportion is less than 5 mol %, the coefficient of linear thermal expansion of the polymer tends to increase and a difference in the coefficient of linear thermal expansion between the polymer and a metallic material of low thermal expansion used therewith facilitates occurrence of warpage. When the proportion exceeds 85 mol %, the alkali developability tends to deteriorate.

A polyimide precursor to be used in this invention contains the structural units represented by formulas (1), (2), and (3) as essential structural units; however, it may contain structural units derived from other diamines if in small amounts. The structural unit of this kind is preferably represented by formula (11).

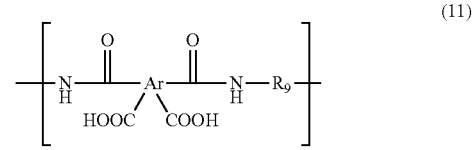

(11)

In formula (11), $R_9$ is a divalent hydrocarbon group and is derived from the main structure of a diamine. Examples of such diamines include 4,4'-diaminodiphenyl ether, 3,4'-diaminodiphenyl ether, 4,4'-diamino-2'-methoxybenzanilide, 4,4'-diaminobenzanilide, 3,4'-diaminobenzanilide, 1,4-bis (4-aminophenoxy)benzene, 1,3-bis(4-aminophenoxy)benzene, 1,3-bis(3-aminophenoxy)benzene, 1,4-diaminobenzene, 1,3-diaminobenzene, 2,4-diaminotoluene, 4,4'-diaminodiphenylmethane, 4,4'-diaminodiphenyl sulfone, 3,3'-diaminodiphenyl sulfone, 4,4'-diaminobiphenyl, 4,4'-diaminobenzophenone, 4,4'-diaminodiphenyl sulfide, and 2,2-bis[4-(4-aminophenoxy)phenyl]propane. These diamines may be used singly or as a combination of two species or more. The aforementioned diamines also provide preferable examples of those diamines containing no ester group which are used in the case where Y in formula (1) is a divalent aromatic group containing no ester group. The group Ar is a tetravalent aromatic group that contains no ester group.

The proportion of the structural unit represented by formula (11) in the polyimide precursor is preferably controlled in the range not exceeding 50 mol %. When this proportion exceeds 50 mol %, there may arise a possibility that any or all of the prescribed properties regarding the coefficient of linear thermal expansion, alkali developability, and patterning performance are not displayed. More preferably, the proportion is controlled in the range not exceeding 20 mol %.

The aforementioned polyimide precursor can be synthesized by the reaction of at least three kinds of aromatic diamines that are respectively capable of yielding the aforementioned structural units with at least one kind of aromatic tetracarboxylic acid dianhydride at a molar ratio of nearly 1:1. The reaction is preferably carried out in an organic solvent at a temperature in the range of 0-60° C. When the reaction temperature is too low, the reaction does not proceed sufficiently and there is a possibility that a polyimide having a molecular weight of desired magnitude is not obtained. On the other hand, when the reaction temperature is too high, polymerization and imidization take place at the same time in some cases wherein not only the solubility of the product polymer in a developer based on an aqueous alkaline solution decreases but also the reaction solution undergoes gelation.

Examples of the organic solvents useful for the reaction include dimethyl sulfoxide, N,N-dimethylformamide, N,N-dimethylacetamide, N-methyl-2-pyrrolidone, hexamethylphosphoric triamide, phenol, cresol, and γ-butyrolactone and these solvents may be used singly or as a mixture. The amount of the solvent is not specifically limited and it is preferably controlled so that the concentration of the polyamic acid to be formed by the polymerization reaction falls in the range of 5-40 wt %.

A photosensitive resin composition in this invention comprises the polyimide precursor obtained in the aforementioned manner and a photopolymerization initiator as essential components and it is allowable to add other resins, monomers such as an acrylate, sensitizers, solvents, and the like to the composition according to the need. In this manner, a photosensitive resin composition can acquire excellent properties suitable for practical use.

In the case where an acrylate is incorporated in a photosensitive resin composition, examples of useful acrylates include monoacrylates such as 2-ethylhexyl acrylate, 2-hydroxyethyl acrylate, 2-hydroxypropyl acrylate, 2-hydroxyethylacryloyl phosphate, 2-methoxyethoxyethyl acrylate, 2-ethoxyethoxyethyl acrylate, tetrahydrofurfuryl acrylate, phenoxyethyl acrylate, isodecyl acrylate, stearyl acrylate, lauryl acrylate, glycidyl acrylate, allyl acrylate, ethoxy acrylate, methoxy acrylate, 2-(N,N-dimethylamino)ethyl acrylate, benzyl acrylate, dicyclopentadienyl acrylate, and dicyclopentadiene ethoxy acrylate and polyfunctional acrylates such as dicyclopentenyl acrylate, dicyclopentenyloxyethyl acrylate, 1,3-butanediol diacrylate, 1,4-butanediol diacrylate, 1,6-hexanediol diacrylate, diethylene glycol diacrylate, neopentyl glycol diacrylate, polyethylene glycol 200 diacrylate, polyethylene glycol 400 diacrylate, polyethylene glycol 600 diacrylate, neopentyl glycol hydroxypivalate diacrylate, triethylene glycol diacrylate, bis(acryloxyethoxy)bisphenol A, bis(acryloxyethoxy)tetrabromobisphenol A, tripropylene glycol diacrylate, trimethylolpropane triacrylate, pentaerythritol triacrylate, tris(2-hydroxyethyl) isocyanate, pentaerythritol tetraacrylate, dipentaerythritol hexaacrylate, and dipentaerythritol monohydroxy pentaacrylate. In the case where an acrylate, preferably a polyfunctional acrylate, is used, it is incorporated at a rate of 5-60 parts by weight, preferably 10-40 parts by weight, more preferably 10-30 parts by weight, per 100 parts by weight of the polyimide precursor.

A radical photopolymerization initiator may be incorporated as a photopolymerization initiator in a photosensitive resin composition. The radical photopolymerization initiator generates polymerizable radicals upon photoirradiation and the radicals react with unsaturated linkages in a photosensitive resin composition to form a crosslinked structure thereby insolubilizing the polymer in a developer. A variety of photopolymerization initiators are available for use as radical photopolymerization initiators here and examples include acetophenone, 2,2-dimethoxyacetophenone, p-dimethylaminoacetophenone, Michler's ketone, benzil, benzoin, benzoin methyl ether, benzoin ethyl ether, benzoin n-propyl ether, benzoin isopropyl ether, benzoin n-butyl ether, benzil dimethyl ketal, thioxanthone, 2-chlorothioxanthone, 2-methylthioxanthone, 2-hydroxy-2-methyl-1-phenylpropan-1-one, 1-(4-isopropylphenyl)-2-hydroxy-2-methylpropan-1-one, methyl benzoylformate, and 1-hydroxycyclohexyl phenyl ketone. The photopolymerization intiator is used at a rate of 1-20 parts by weight, preferably 1-10 parts by weight, per 100 parts by weight of the polyimide precursor.

Further, it is advantageous to incorporate a sensitizer and 4,4'-bis(diethylamino)benzophenone may be used as such in this case. The sensitizer is added at a rate of 0.01-2 parts by weight, preferably 0.05-0.5 part by weight, per 100 parts by weight of the polyimide precursor.

The viscosity of a photosensitive resin composition in this invention can be controlled by a variety of organic solvents. Examples of such organic solvents include triethylene glycol dimethyl ether, diethylene glycol dimethyl ether, N,N-dimethylacetamide, N-methylpyrrolidone, propylene glycol monomethyl ether acetate, ethyl lactate, dimethyl sulfoxide, N,N-dimethylformamide and γ-butyrolactone and mixtures thereof. The solvent is used at a rate of 10-100 parts by weight per 100 parts by weight of the solids in a photosensitive resin composition. In the case where the organic solvent used as a reaction solvent in the preparation of a polyimide precursor remains, the remainder is counted as part of the solvent to be added.

A photosensitive resin composition in this invention can be used in the commonly known manner. For example, it can be applied by a coating method to a substrate such as a silicon wafer, a ceramic substrate, a rigid substrate, and a flexible substrate. The method of coating is not specifically limited and a method such as spin coating, slit coating, roll coating, and printing is used. After application, the composition is dried to form a film at 50-180° C., preferably at 80-140° C. The thickness of the film after drying is controlled at the prescribed value by adjusting the concentration of the solution of the photosensitive resin composition and the thickness of the applied solution. In the case where the film is intended for use as protective films and coverlay films of semiconductor devices, the coating is normally performed in such a manner as to control the thickness of the film in the range of 50-100 μm. When the thickness is too small, the film cannot satisfactorily protect the device or the circuit underneath it. When the thickness is too large, it becomes difficult to obtain an accurate pattern.

The film is then exposed to light through a mask of a prescribed pattern. Ultraviolet light or visible light whose wavelength is in the range of 200-500 nm is used as a light source for this exposure.

The prescribed pattern is obtained by dissolving off the unexposed portion of the exposed film by a developer. In the case where the photosensitive resin composition of this invention is used, radicals generated from the photopolymerization initiator upon photoirradiation undergo a chain reaction with unsaturated linkages and insolubilize the film in the developer. Since the unexposed portion is soluble in an alkaline developer, the pattern is formed by utilizing the difference in solubility in the developer between the exposed and unexposed portions.

The developers to be used in this developing step are based on aqueous solutions of inorganic and organic alkaline substances. Examples of inorganic alkaline substances include sodium hydroxide, potassium hydroxide, and sodium carbonate and examples of organic alkaline substances include primary amines such as ethylamine and n-propylamine, secondary amines such as diethylamine and di-n-propylamine, tertiary amines such as triethylamine and methyldiethylamine, alcoholamines such as dimethylethanolamine and triethanolamine, and quaternary ammonium salts such as tetramethylammonium hydroxide (TMAH) and tetraethylammonium hydroxide. Further, a developer formed by adding a suitable amount of a water-soluble alcohol such as methanol, ethanol, 1-propanol, and 2-propanol and a surfactant to one of the aforementioned alkaline substances can be used satisfactorily. A practice known for improvement of the developing property is addition of an organic solvent capable of dissolving polymers with relative ease, for example, a polar aprotic solvent such as NMP, N,N-dimethylformamide (DMF), N,N-dimethylacetamide (DMAc), and dimethyl sulfoxide (DMSO). However, this practice is not necessary in this invention and it is desirable that it is not used. A method such as spraying, puddling, and dipping is used for development.

The pattern formed in the aforementioned manner is washed with distilled water or the like and then submitted to a heat treatment (post cure). The polyimide precursor undergoes dewatering cyclization to form imide rings during the post cure step and this contributes to yield a pattern of excellent heat resistance. The heat treatment is preferably carried out at 180-400° C. for 10-120 minutes, more preferably at 180-300° C. The temperature may be raised stepwise in the heating step.

After exposure to light or after exposure to light, development, and washing, the film of the photosensitive resin composition of this invention is cured by submitting it to the aforementioned post cure as a heat treatment to effect imidization. The cured film is controlled to have a coefficient of linear thermal expansion of not more than $40 \times 10^{-6}$/K, preferably not more than $20 \times 10^{-6}$/K.

EXAMPLES

This invention will be explained concretely with reference to the examples below. Evaluation of the patterning performance and measurement of the coefficient of linear thermal expansion were conducted as follows.
(Evaluation of Patterning Performance)

The photosensitive resin composition was applied to the copper side of a copper-clad laminate (ESPANEX MC12-25-00CEM, a product of Nippon Steel Chemical Co., Ltd.) by spin coating and dried by heating at 110° C. for 3 minutes. The dried film of the composition was exposed to light from a high-pressure mercury lamp at a total dosage of 1,000 mJ. The exposed film was developed by a 2.38 wt % aqueous TMAH solution at 30° C. for 2 minutes and 45 seconds. The pattern thus obtained was washed with water and post-cured at 220° C. for 30 minutes. The thickness of the film after post cure was approximately 10 μm. The patterning performance was evaluated on the basis of the minimum resolvable via hole diameter.
<Measurement of Coefficient of Linear Thermal Expansion (CTE)>

The coefficient of linear thermal expansion was measured as follows; the photosensitive resin composition was applied to a substrate made from a copper foil, developed, and post-cured to form a pattern, the substrate was removed to yield a specimen in the form of a film, and the specimen was tested with the aid of TMA100 manufactured by Seiko Instruments Inc. by cooling the specimen to −20° C., then raising the temperature to 250° C. at a rate of 10° C./min, and calculating the coefficient of linear thermal expansion from the average over the range of 100° C. to 200° C.

The abbreviations used in the examples refer to the following compounds.
APAB: 4-Aminophenyl 4'-aminobenzoate
BAPT: Bis(4-aminophenyl) terephthalate
mTB: 4,4'-Diamino-2,2'-dimethylbiphenyl
VAB: 4,4'-Diamino-2,2'-divinylbiphenyl
MAB: 4,4'-Diamino-2,2'-dimethacryloxybiphenyl
TFMB: 4,4'-Diamino-2,2'-bis(trifluoromethyl)biphenyl Example 1

In a 300-ml three-necked flask under a nitrogen flow, 6.2 g (0.027 mol) of APAB, 9.6 g (0.045 mol) of mTB, and 4.3 g (0.018 mol) of VAB were dissolved in 160 g of N,N-dimethylacetamide. To the solution was added 19.2 g (0.088 mol) of PMDA at room temperature with stirring and the mixture was further stirred for 3 hours to yield a polyimide precursor solution 1.

To 100 parts by weight of the polyimide precursor (as solid) thus obtained were added 5 parts by weight of Irgacure OXE-02 manufactured by Ciba Japan as a radical polymerization initiator and 30 parts by weight of PET-30 manufactured by Nippon Kayaku Co., Ltd. as a polyfunctional acrylate. After the addition, the mixture was stirred sufficiently by means of an agitator and then air bubbles were removed from the resin by vacuum defoaming to yield a photosensitive resin composition.

The photosensitive resin composition thus obtained was evaluated for patterning performance and measured for the coefficient of linear thermal expansion. The composition of raw materials for the polyimide precursor and the results of evaluation are shown for each example in Table 1.

Example 2

In a 300-ml three-necked flask under a nitrogen flow, 14.3 g (0.063 mol) of APAB, 1.9 g (0.009 mol) of mTB, and 4.2 g (0.018 mol) of VAB were dissolved in 160 g of N,N-dimethylacetamide. To the solution was added 19.0 g (0.087 mol) of PMDA at room temperature with stirring and the mixture was further stirred for 3 hours to yield a polyimide precursor solution 2.

Example 3

In a 300-ml three-necked flask under a nitrogen flow, 10.3 g (0.045 mol) of APAB, 5.7 g (0.027 mol) of mTB, and 4.3 g (0.018 mol) of VAB were dissolved in 160 g of N,N-dimethylacetamide. To the solution was added 19.1 g (0.088 mol) of PMDA at room temperature with stirring and the mixture was further stirred for 3 hours to yield a polyimide precursor solution 3.

Example 4

In a 300-ml three-necked flask under a nitrogen flow, 6.1 g (0.027 mol) of APAB, 3.8 g (0.018 mol) of mTB, and 10.6 g (0.045 mol) of VAB were dissolved in 160 g of N,N-dimethylacetamide. To the solution was added 18.9 g (0.087 mol) of PMDA at room temperature with stirring and the mixture was further stirred for 3 hours to yield a polyimide precursor solution 4.

Example 5

In a 300-ml three-necked flask under a nitrogen flow, 9.3 g (0.041 mol) of APAB, 5.2 g (0.024 mol) of mTB, and 3.9 g (0.017 mol) of VAB were dissolved in 160 g of N,N-dimethylacetamide. To the solution were added 14.1 g (0.065 mol) of PMDA and 7.4 g (0.016 mol) of TAHQ at room temperature with stirring and the mixture was further stirred for 3 hours to yield a polyimide precursor solution 5.

Example 6

In a 300-ml three-necked flask under a nitrogen flow, 12.3 g (0.058 mol) of mTB and 3.4 g (0.014 mol) of VAB were dissolved in 160 g of N,N-dimethylacetamide. To the solution were added 7.6 g (0.036 mol) of PMDA and 16.4 g (0.036 mol) of TAHQ at room temperature with stirring and the mixture was further stirred for 3 hours to yield a polyimide precursor solution 6.

Example 7

In a 300-ml three-necked flask under a nitrogen flow, 18.5 g (0.053 mol) of BAPT, 1.6 g (0.008 mol) of mTB, and 3.6 g (0.015 mol) of VAB were dissolved in 160 g of N,N-dimethylacetamide. To the solution was added 16.3 g (0.075 mol) of PMDA at room temperature with stirring and the mixture was further stirred for 3 hours to yield a polyimide precursor solution 7.

Example 8

In a 300-ml three-necked flask under a nitrogen flow, 9.9 g (0.043 mol) of APAB, 5.5 g (0.026 mol) of mTB, and 6.1 g (0.017 mol) of MAB were dissolved in 160 g of N,N-dimethylacetamide. To the solution was added 18.5 g (0.085 mol) of PMDA at room temperature with stirring and the mixture was further stirred for 3 hours to yield a polyimide precursor solution 8.

Example 9

In a 300-ml three-necked flask under a nitrogen flow, 9.6 g (0.042 mol) of APAB, 8.1 g (0.025 mol) of TFMB, and 4.0 g (0.017 mol) of VAB were dissolved in 160 g of N,N-dimethylacetamide. To the solution was added 18.2 g (0.084 mol) of PMDA at room temperature with stirring and the mixture was further stirred for 3 hours to yield a polyimide precursor solution 9.

A photosensitive resin composition was prepared as in Example 1 from each of the polyimide precursors obtained in Examples 2 to 9 by addition of the radical polymerization initiator and the polyfunctional acrylate, sufficient stirring of the mixture by means of an agitator, and removal of air bubbles from the resin by vacuum defoaming.

The photosensitive resin compositions of Examples 2 to 9 were respectively evaluated for patterning performance and measured for the coefficient of linear thermal expansion. The composition of raw materials for the polyimide precursor and the results of evaluation are shown for each example in Table 1.

Comparative Example 1

A polyimide precursor solution was synthesized as in Example 1 except that VAB was not used and the other raw materials were used in the amounts shown in Table 1. The polyimide precursor was then processed as in Example 1 to yield a photosensitive resin composition. The photosensitive resin composition did not form a recognizable pattern after exposure to light and the exposed composition wholly dissolved in a developer at the time of development and, as a result, a film for measurement of the coefficient of linear thermal expansion could not be obtained.

Comparative Example 2

A polyimide precursor solution was synthesized as in Example 1 except that ARAB was not used and the other raw materials were used in the amounts shown in Table 2. The polyimide precursor was then processed as in Example 1 to yield a photosensitive resin composition. The photosensitive resin composition formed a recognizable pattern after exposure to light, but the pattern could not remain after development as the exposed composition swelled and peeled off at the time of development because of the absence of difference in solubility between the exposed and unexposed portions. Thus, a film for measurement of the coefficient of linear thermal expansion could not be obtained.

Comparative Example 3

A polyimide precursor solution was synthesized as in Example 1 except that mTB was not used and the other raw materials were used in the amounts shown in Table 2. The polyimide precursor was then processed as in Example 1 to yield a photosensitive resin composition. The photosensitive resin composition formed a recognizable pattern after exposure to light, but the pattern was washed out wholly at the time of development. Thus, a film for measurement of the coefficient of linear thermal expansion could not be obtained.

TABLE 1

|  | Example | | | | | | | | |
| --- | --- | --- | --- | --- | --- | --- | --- | --- | --- |
|  | 1 | 2 | 3 | 4 | 5 | 6 | 7 | 8 | 9 |
| Raw material (g) | | | | | | | | | |
| APAB | 6.2 | 14.3 | 10.3 | 6.1 | 9.3 | 0 | 0 | 9.9 | 9.6 |
| BAPT | 0 | 0 | 0 | 0 | 0 | 0 | 18.5 | 0 | 0 |
| mTB | 9.6 | 1.9 | 5.7 | 3.8 | 5.2 | 12.3 | 1.6 | 5.5 | 0 |

TABLE 1-continued

| | Example | | | | | | | | |
|---|---|---|---|---|---|---|---|---|---|
| | 1 | 2 | 3 | 4 | 5 | 6 | 7 | 8 | 9 |
| VAB | 4.3 | 4.2 | 4.3 | 10.6 | 3.9 | 3.4 | 3.6 | 0 | 4.0 |
| MAB | 0 | 0 | 0 | 0 | 0 | 0 | 0 | 6.1 | 0 |
| TFMB | 0 | 0 | 0 | 0 | 0 | 0 | 0 | 0 | 8.1 |
| PMDA | 19.2 | 19 | 19.1 | 18.9 | 14.1 | 7.8 | 16.3 | 18.5 | 18.2 |
| TAHQ | 0 | 0 | 0 | 0 | 7.4 | 16.4 | 0 | 0 | 0 |
| Property | | | | | | | | | |
| Diameter of via hole (μm) | 50 | 75 | 75 | 50 | 40 | 40 | 75 | 75 | 75 |
| CTE (×10$^{-6}$/K) | 16 | 12 | 16 | 18 | 20 | 15 | 22 | 18 | 17 |

TABLE 2

| | Comparative example | | |
|---|---|---|---|
| Raw material (g) | 1 | 2 | 3 |
| APAB | 6.3 | 0 | 16.3 |
| mTB | 13.6 | 15.6 | 0 |
| VAB | 0 | 4.3 | 4.2 |
| PMDA | 19.4 | 19.4 | 18.9 |

As is apparent from the results shown in Table 1, it is confirmed in each of the examples that the photosensitive resin composition displays sufficient patterning performance against an alkaline developer and, further, the coefficient of linear thermal expansion is sufficiently low to effectively reduce warpage. In contrast, patterning was not possible and a patterned film could not be obtained in each of the comparative examples and it was confirmed that the resin compositions obtained in the comparative examples cannot be used as photosensitive resin compositions.

INDUSTRIAL APPLICABILITY

A photosensitive resin composition provided by this invention has sufficient patterning properties against alkaline developers and its coefficient of linear thermal expansion is sufficiently low to effectively reduce warpage. Further, the photosensitive resin composition can be cured by heating at a temperature below 250° C. and it is of high industrial value because of its applicability to the production of semiconductor devices on which a high-temperature treatment is difficult to perform.

The invention claimed is:

1. A photosensitive resin composition containing a polyimide precursor consisting essentially of structural units represented by the following formulas (1), (2) and (3), wherein the proportion of the structural unit represented by formula (3) in the polyimide precursor is 5-60 mol %:

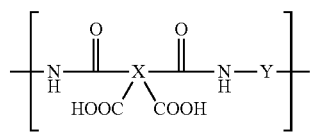

(1)

(2)

(3)

wherein in formula (1), X is a tetravalent aromatic group formed by removing the carboxyl groups from an aromatic tetracarboxylic acid, and the tetravalent aromatic group comprises a group derived from pyromellitic dianhydride; Y is a divalent aromatic group formed by removing the amino groups from an aromatic diamine, and Y contains an ester group (—COO—); and wherein in formulas (2) and (3), Ar is a tetravalent aromatic group formed by removing the carboxyl groups from an aromatic tetracarboxylic acid, and the tetravalent aromatic group comprises a group derived from pyromellitic dianhydride; each of $R_1$ to $R_4$ is independently a hydrogen atom, a substituted or unsubstituted alkyl group of 1-6 carbon atoms, a phenyl group, or an alkoxyl group of 1-6 carbon atoms; each of $R_5$ and $R_6$ is independently a monovalent organic group of 2-6 carbon atoms having a radically polymerizable unsaturated linkage.

2. The photosensitive resin composition as described in claim 1 wherein a photopolymerization initiator is incorporated at a rate of 1-20 parts by weight per 100 parts by weight of the polyimide precursor.

3. The photosensitive resin composition as described in claim 1 wherein the composition can be developed by a developer based on an aqueous alkaline solution.

4. A cured film which is obtained from a photosensitive resin composition by exposure to light and heat curing the photosensitive resin composition containing a polyimide precursor consisting essentially of structural units represented by the following formulas (1), (2), and (3) wherein the proportion of the structural unit represented by formula (3) in the polyimide precursor is 5-60 mol %,

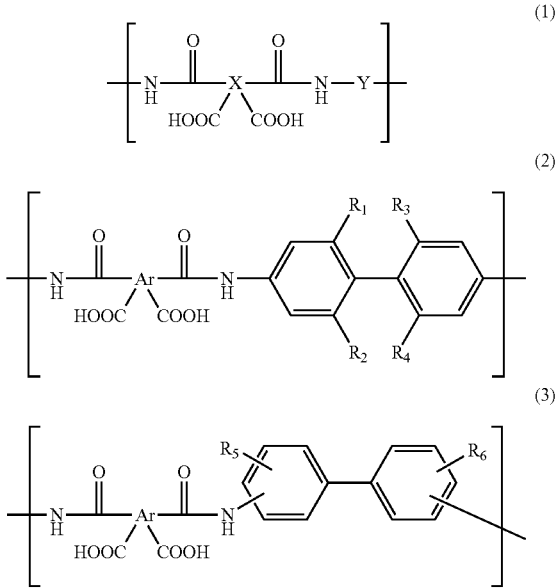

wherein in formula (1), X is a tetravalent aromatic group formed by removing the carboxyl groups from an aromatic tetracarboxylic acid, and the tetravalent aromatic group comprises a group derived for pyromellitic dianhydride; Y is a divalent aromatic group formed by removing the amino groups from an aromatic diamine, and contains an ester group (—COO—);

wherein in formulas (2) and (3), Ar is a tetravalent aromatic group formed by removing the carboxyl groups from an aromatic tetracarboxylic acid, and the tetravalent aromatic group comprises a group derived from pyromellitic dianhydride; each of $R_1$ to $R_4$ is independently a hydrogen atom, a substituted or unsubstituted alkyl group of 1-6 carbon atoms, a phenyl group, or an alkoxyl group of 1-6 carbon atoms; each of $R_5$ and $R_6$ is independently a monovalent organic group of 2-6 carbon atoms having a radically polymerizable unsaturated linkage; and wherein the cured film has a coefficient of linear thermal expansion of not more than $40 \times 10^{-6}$/K.

5. The photosensitive resin composition as described in claim 1, wherein the proportion of the structural unit represented by formula (1) in the polyimide precursor is 10-80 mol %, and the proportion of the structural unit represented by formula (2) in the polyimide precursor is 5-85 mol %.

6. The photosensitive resin composition as described in claim 4, wherein the proportion of the structural unit represented by formula (1) in the polyimide precursor is 10-80 mol %, and the proportion of the structural unit represented by formula (2) in the polyimide precursor is 5-85 mol %.

\* \* \* \* \*